United States Patent [19]

Ishigami et al.

[11] Patent Number: 5,812,192

[45] Date of Patent: Sep. 22, 1998

[54] SOLID STATE IMAGING APPARATUS HAVING A CHANNEL STOP SECTION FOR FORMING A TRANSFER CHANNEL BETWEEN FIRST AND SECOND TRANSFER SECTIONS IN A HORIZONTAL TRANSFER REGISTER

[75] Inventors: Tomio Ishigami; Atsushi Kobayashi, both of Kanagawa, Japan

[73] Assignee: Sony Corporation, Tokyo, Japan

[21] Appl. No.: 533,741

[22] Filed: Sep. 26, 1995

[30] Foreign Application Priority Data

Sep. 27, 1994 [JP] Japan .................................. 6-231203

[51] Int. Cl.$^6$ ................................................. H04N 5/335
[52] U.S. Cl. ........................ 348/321; 348/250; 348/312; 348/319; 348/323
[58] Field of Search .................................... 257/221, 241, 257/248, 250; 348/241, 250, 294, 311, 312, 315, 316, 317, 319, 320, 321, 322, 323, 324; H04N 3/14, 5/335

[56] References Cited

U.S. PATENT DOCUMENTS

| | | | |
|---|---|---|---|
| 4,528,594 | 7/1985 | Kadekodi et al. | 348/315 |
| 4,750,042 | 6/1988 | Murayama et al. | 348/323 |
| 4,807,037 | 2/1989 | Iesaka et al. | 348/323 |
| 5,194,751 | 3/1993 | Yonemoto et al. | 257/229 |
| 5,291,294 | 3/1994 | Hirota | 348/316 |
| 5,339,162 | 8/1994 | Tani | 348/298 |
| 5,387,935 | 2/1995 | Kobayashi | 348/323 |

FOREIGN PATENT DOCUMENTS

| | | | |
|---|---|---|---|
| A-0 383 519 | 8/1990 | European Pat. Off. | G11C 27/04 |
| A-0 444 696 | 9/1991 | European Pat. Off. | H04N 5/335 |
| A-0 593 922 | 4/1994 | European Pat. Off. | H01L 27/148 |
| 3-72790 | 3/1991 | Japan | H04N 5/335 |
| 6-105239 | 4/1994 | Japan | H04N 5/335 |

OTHER PUBLICATIONS

IEEE International Solid State Circuits Conference, vol. 36, 1993, New York US, pp. 192–193–288, XP000388706, A. Kobayashi et al.: "A 1/2–in 380k–pixel progressive scan CCD image sensor", p. 193; figures 1, 3–5.

*Primary Examiner*—Wendy Garber
*Assistant Examiner*—Ngoc-Yen Vu
*Attorney, Agent, or Firm*—Frommer Lawrence & Haug LLP; William S. Frommer

[57] ABSTRACT

There is provided a solid state imaging apparatus which has realized sharing of signal charges without generation of a fault of image like a vertical stripe resulting from defective sharing of signal charges in a horizontal transfer register consisting of a pair of transfer sections for horizontal transfer by sharing therewith the signal charges of the same pixel. In this solid state imaging apparatus, a pair of horizontal transfer registers 4 (6) are provided to execute horizontal transfer by sharing the signal charges of the same pixel in the first horizontal transfer register 4 in the side of the image section with a pair of transfer sections 4a, 4b with the control gate section 5. For the sharing of signal charges, a transfer channel 17 is formed in the transfer gate section 5 between the bit (φH2) of the transfer section 4a and the bit (φH1) one bit after, in the horizontal transfer direction, the bit (φH2) of the transfer section 4b forming a pair with above bit of the transfer section 4a and thereby the signal charges are shared with a pair of transfer sections 4a and 4b through the transfer channel 17.

10 Claims, 6 Drawing Sheets

SOLID STATE IMAGING APPARATUS HAVING A CHANNEL STOP SECTION FOR FORMING A TRANSFER CHANNEL BETWEEN FIRST AND SECOND TRANSFER SECTIONS IN A HORIZONTAL TRANSFER REGISTER

BACKGROUND OF THE INVENTION

Field of the Invention

The present invention relates to a solid state imaging apparatus and particularly to a CCD solid state imaging apparatus of a so-called "non-interlaced scanning system" for reading signal charges read from each pixel without mixing of these signal charges in a vertical transfer register.

Description of Related Art

As a CCD solid state imaging apparatus, there is provided a known apparatus constituted to raise resolution by providing, for example, two horizontal transfer registers and enable read operation for all pixels by simultaneous horizontal transfer of the signal charges of odd-numbered lines and even-numbered lines with individual horizontal transfer registers and by reading signal charges of two lines within 1 H (H means a horizontal scanning period).

Amount of charges to be processed by the horizontal transfer registers can be increased sufficiently by setting a wider channel width of the horizontal transfer registers. Since amount of charges to be processed by the horizontal transfer register is proportional to an area per bit of the register when the amplitude of the clock pulse for horizontal transfer is kept constant, amount of charges to be processed can be increased by expanding channel length and channel width corresponding to one bit. But since the channel length corresponding to one bit of the horizontal transfer register is restricted by a size of image section, expansion is allowed only to the channel width.

However, when the channel width is expanded, field intensity generated in the register by the clock pulse for horizontal transfer impressed to a transfer electrode is lowered. Particularly, such field intensity is lowered at the central area in the channel width direction of the horizontal transfer register. Such drop of transfer field intensity brings about a fall of transfer efficiency of signal charges in the vertical direction of the horizontal transfer register. As a result, a part of the signal charges is sometimes left untransferred. That is, in the CCD solid state imaging apparatus of the non-interlaced scanning system, the perfect transfer is disabled when the signal charges corresponding to one line are transferred in parallel to the register in the opposite side from the register in the image section side among two horizontal transfer registers and thereby resulting in a possibility of deterioration of image quality.

Also known is the CCD solid state imaging apparatus of the non-interlaced scanning system (for example, refer to the Japanese Patent Laid-open No. Hei 3-72790), wherein a horizontal transfer register in the image section side is formed of a couple of transfer sections in order to increase the amount of charges to be processed without deterioration of the transfer efficiency in the horizontal transfer register and the signal charges of the same pixel are shared with these transfer sections to realize the horizontal transfer. Outline of constitution and operations of such imaging apparatus will be explained hereunder.

Figure 9:
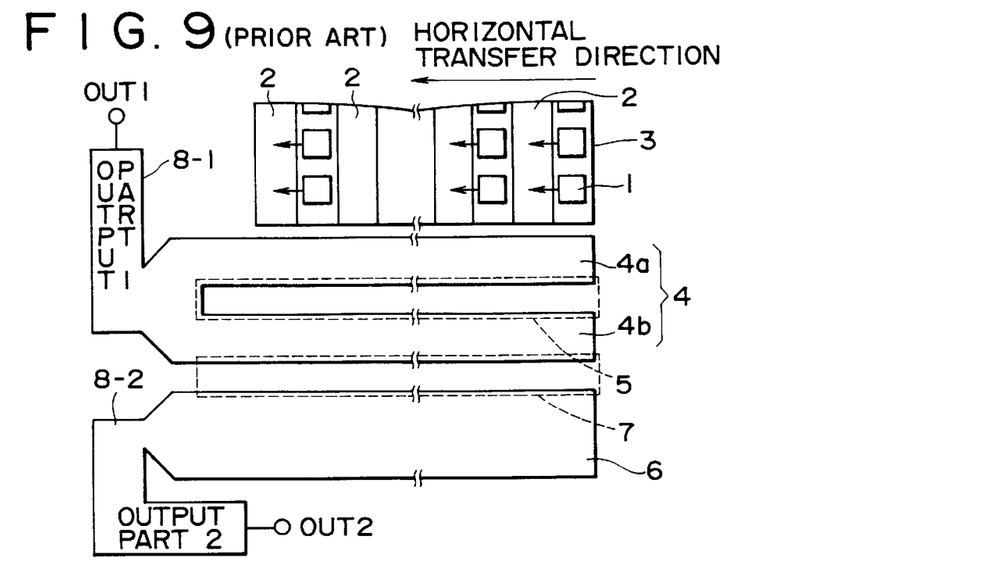
FIG. 9 is a plan view indicating an example of a constitution of a CCD solid state imaging apparatus of the non-interlaced scanning system.

In FIG. 9, a CCD image section 3 of the interline transfer system is composed of a plurality of photosensors 1 arranged in two dimensions in the form of matrix and a plurality of vertical transfer registers which are arranged for each column of these photosensors for vertical transfer of the signal charges generated by the photosensors 1. Under this image section 3, a first horizontal transfer register 4 is arranged and this first horizontal transfer register 4 is composed of a couple of transfer sections 4a, 4b which share with each other the horizontal transfer of signal charges corresponding to one line. These transfer sections 4a, 4b are arranged in parallel keeping a short distance therebetween in almost the same channel width and are integrated at the output section. A sum of the channel widths of the transfer sections 4a, 4b becomes equal to the channel width of the first horizontal transfer register 4 which is the value to obtain sufficient amount of charges to be processed.

In the first horizontal transfer register 4, a control gate section 5 is provided between a couple of transfer sections 4a, 4b and this control gate section 5 shares the signal charges of the same pixel with the transfer sections 4a, 4b. Under the first horizontal transfer register 4, a second horizontal transfer register 6 is arranged in parallel keeping a certain distance therefrom. The channel width of the second horizontal transfer register 6 is set almost equal to the channel width of the first horizontal transfer register 4. A transfer gate 7 is provided between the first horizontal transfer register 4 and the second horizontal transfer register 6 which control to further transfer, to the second horizontal transfer register 6, the signal charges corresponding to one line transferred to the first horizontal transfer register 4 from the vertical transfer register 5. The signal charges transferred horizontally by the first and second horizontal transfer registers 4, 6 are converted to signal voltages by output sections 8-1, 8-2 and are then outputted as OUT1 and OUT2.

As explained, since the first horizontal transfer register 4 is constituted of a couple of transfer sections 4a, 4b, individual channel width of the transfer sections 4a, 4b can be narrowed even when the first horizontal transfer register 4 as a whole has a wider channel width. As a result, a transfer field intensity is never lowered and thereby transfer efficiency of the signal charges to the second horizontal transfer register 6 through the first horizontal transfer register 4 is never deteriorated. In other words, the amount of charges to be processed can be increased without deterioration of the transfer efficiency in the vertical transfer direction in the first horizontal transfer register 4.

Since the signal charges which are shared with and transferred to a couple of transfer sections 4a, 4b are combined again at the output section 8-1 in the first horizontal transfer register 4, the amount of charges per bit to be processed in the first horizontal transfer register 4 is constant without relation to the amount of charges to be transferred in a couple of transfer sections 4a, 4b. However, since the amount of charges per bit to be processed in a couple of transfer sections 4a, 4b is determined depending on the channel length and channel width corresponding to one bit, if the signal charges shared with one transfer section have exceeded the amount of charges to be processed of the relevant transfer section when the signal charges are shared with the transfer sections 4a, 4b, all signal charges of one pixel cannot be transferred perfectly, although the amount of charges to be processed in the first horizontal transfer register 4 can be increased.

With this background, the inventors of the present invention have proposed (refer to the official gazette of the Japanese Patent Laid-Open No. Hei 6105239) a CCD solid state imaging apparatus of the non-interlaced scanning system which enables sharing of signal charges considering the amount of charges to be processed in the transfer sections 4a, 4b at the time of sharing signal charges with a couple of transfer sections 4a, 4b. Namely this CCD solid state imaging apparatus employs, as shown in FIG. 10, a constitution that a potential barrier section 13 is formed along the horizontal transfer direction within the channel of the control gate section 5 between a couple of transfer sections 4a, 4b.

Such CCD solid state imaging apparatus of the non-interlaced scanning system has been previously disclosed in the U.S. Pat. No. 5,387,935 (Issue date; Feb. 7, 1995). The disclosure of the reference is hereby incorporated herein.

Continuously, after the signal charges are once accumulated in the control gate section 5 through the transfer section 4a, a gate pulse φHHG to be impressed to a gate electrode 16 of the control gate section 5 is set as a middle level, under the condition that the clock pulse φH1 of the first phase is set as a low level, while the clock pulse φH2 of the second phase is set as a high level. In this case, the signal charges overflowing the potential barrier section 13 return to the transfer section 4a. On the other hand, the signal charges remaining in the control gate section 5 are transferred to the transfer section 4b when the gate pulse φHHG turns to the low level. Thereby, the signal charges are shared with the transfer sections 4a, 4b in the first horizontal transfer register 4.

Figure 10:
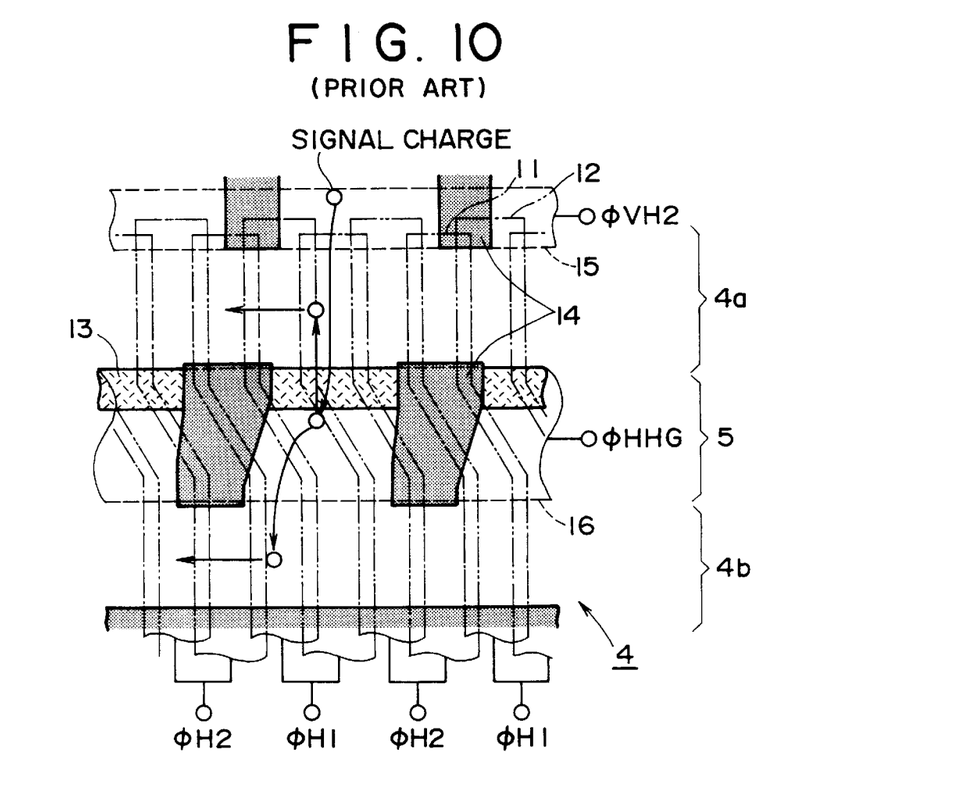
FIG. 10 is a plan view of the pattern indicating a prior art.
Figure 11:
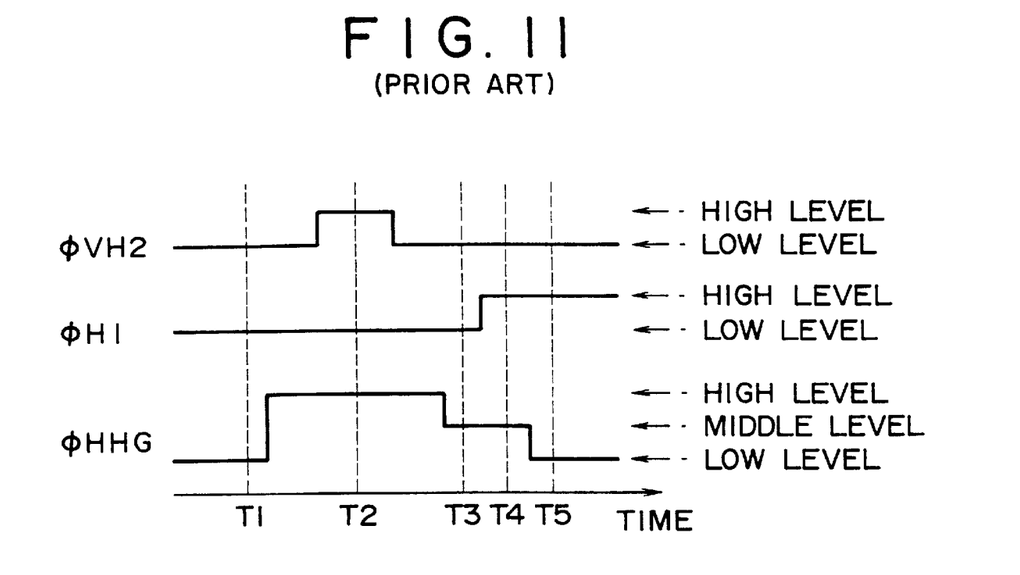
FIG. 11 is a timing chart for explaining operation of the prior art.
Figure 12:
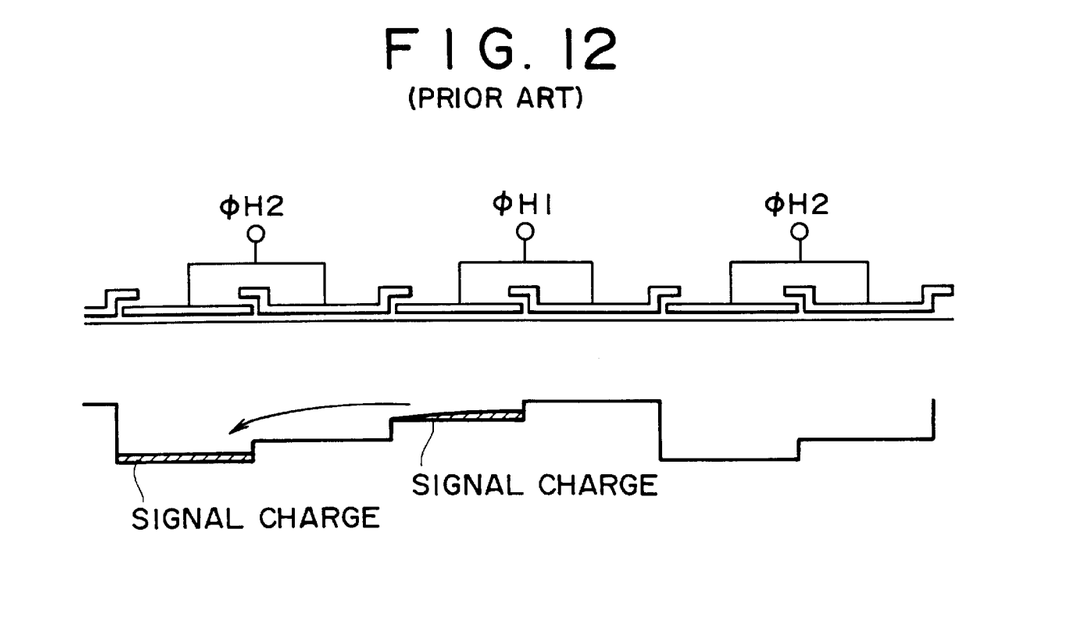
FIG. 12 is a potential drawing for explaining the problem of the prior art.

However, in the case of the conventional CCD solid state imaging apparatus of the constitution explained above, if the transfer section 4b is ready for horizontal register transfer when the signal charges are once transferred to the bits of the first phase (φH1) of the transfer section 4b from the control gate 5 during the transient period (during the period from the time T3 to the time T4) where the clock pulse φH1 of the first phase changes to the high level from the low level in the timing chart shown in FIG. 11, a part of the signal charges is transferred, as shown in FIG. 12, to the bit of the second phase (φH2) provided at the forward position in the horizontal transfer direction of the bit of the first phase (φH1) by means of the transfer field to the horizontal transfer direction (from right to left in FIG. 10).

In the pattern of transfer channel of FIG. 10, the clock pulse φH2 of the second phase must be set to the low level in order to collect the signal charges in the transfer section 4a and the transfer section 4b from the same pixel to a pair of bits under the same gate. In this timing, the signal charges transferred to the bit of the second phase (φH2) in the forward direction are further mixed with the signal charges in the bit of the first phase (φH1) in further forward direction during the period from the time T4 to the time T5. Mixing of the signal charges in the horizontal direction during apportionment of signal charges is all generated in the horizontal period when the amount of signals in the display exceeds the predetermined amount, it appears on the reproduced display as a fault in the shape of a vertical stripe.

Generation of such fault of image can be prevented by setting the condition that the horizontal register transfer is impossible when the potential of the potential barrier section 13 of the control gate section 5 is shallower than the potential of the bit of the first phase (φH1), that is, the condition that the potential of the bit of the second phase (φH2) is shallower than the potential of the bit of the first phase (φH1). However, in this case, the amount of charges to be processed of the transfer section 4a is restricted by the potential of the potential barrier section 13 and is therefore reduced.

SUMMARY OF THE INVENTION

It is therefore an object of the present invention to provide a solid state imaging apparatus which has enabled sharing of signal charges without generation of a fault in the form of a vertical stripe due to the defective sharing of the signal charges in a horizontal transfer register consisting of a couple of transfer sections for horizontally transferring the shared signal charges of the same pixel.

According to one aspect of the present invention, a solid state imaging apparatus comprises a first horizontal transfer register for horizontally transferring signal charges transferred from an image section and a second horizontal transfer register for horizontally transferring the signal charges transferred from the imaging section through the first horizontal transfer register, wherein the first horizontal transfer register comprises a couple of transfer sections where a pair of bits for processing the signal charges of the same pixel are arranged in the horizontal transfer direction and the signal charges from the same pixel are transferred horizontally after these signal charges are respectively shared therewith, a control gate section where a transfer channel is formed between the bit of the transfer section in the image section side of these two transfer sections and the bit located backward in the horizontal transfer direction of the bit, forming a pair with above bit, of the transfer section in the side of the second horizontal transfer register and a potential barrier section formed along the horizontal transfer direction in a part of the region of the control gate section, thereby after the signal charges are accumulated in the control gate section, the signal charges are shared by controlling a relative potential difference of the control gate section and transfer section.

According to another aspect of the present invention, a solid state imaging apparatus comprises a first horizontal transfer register for horizontally transferring signal charges transferred from the image section and a second horizontal transfer register for horizontally transferring the signal charges transferred from the image section through the first horizontal transfer section, wherein the first horizontal transfer register comprises a couple of transfer sections for horizontally transferring the signal charges from the same pixel after these are shared respectively therewith, a control gate section for sharing the signal charges between these two transfer sections, a first potential barrier section formed along the horizontal transfer direction in a part of the region of the control gate section and a second potential barrier section formed along the horizontal transfer direction in the control gate side of the transfer section in the side of the second horizontal transfer register among two transfer sections, whereby after the signal charges are accumulated in the control gate section, the signal charges can be shared by controlling a relative potential difference of the control gate section and transfer section.

In the solid state imaging apparatus according to one aspect of the present invention, at the time of sharing the signal charges in the first horizontal transfer register, the signal charges transferred from the image section are once stored in the control gate section through the bit of the second phase of the charge transfer section in the image section side. When the gate pulse impressed to the gate electrode of the control gate section is set to a middle level under the condition that the clock pulse of the first phase is set to the low level, while the clock pulse of the second phase to the high level, the signal charges overflowing the potential barrier section of the control gate section return to the bit of the second phase of the charge transfer section in the image section side.

Meanwhile, the signal charges remaining in the control gate section are transferred through the transfer channel of the control gate section, when the gate pulse is changed to the low level, to the bit of the first phase one bit after the bit of the second phase for processing the signal charges of the same pixel of the transfer section in the side of the second horizontal transfer register. Thereby, the signal charges of the same pixel are shared with a couple of transfer sections. When the signal charges transferred to the first phase bit are transferred to the preceding second phase bit, the signal charges of two transfer sections are collected in the pair bits under the same gate electrode. In this timing, since only the signal charges transferred to the bit of the first phase located after one bit are only transferred to the bit of the second phase located one bit before the above bit, the signal charges are never mixed in the horizontal direction.

In the solid state imaging apparatus according to another aspect of the present invention, the operations until the overflow signal charges of the potential barrier section of the control gate section return to the second phase bit of the charge transfer section in the image section side after the signal charges transferred from the image section are once stored in the control gate section are similar to the operations explained previously. On the other hand, since the potential barrier section is formed along the horizontal transfer direction in the control gate section side of the transfer section in the second horizontal transfer register side, a voltage which is higher as much as the potential of the potential barrier section is applied to the first phase bit at the time of sharing the signal charges remaining in the control gate section with the transfer section in the second horizontal transfer register side. Thereby, when transfer of the signal charges remaining in the control gate section is started, the potential of the second phase bit becomes shallower than the potential of the first phase bit, disabling the horizontal register transfer. Therefore, since the signal charges transferred to the first phase bit is never transferred to the preceding second phase bit, mixing of the signal charges in the horizontal direction is never generated.

DESCRIPTION OF THE PREFERRED EMBODIMENTS

The preferred embodiments of the present invention will be explained hereunder in detail with reference to the accompanying drawings.

Figure 1:
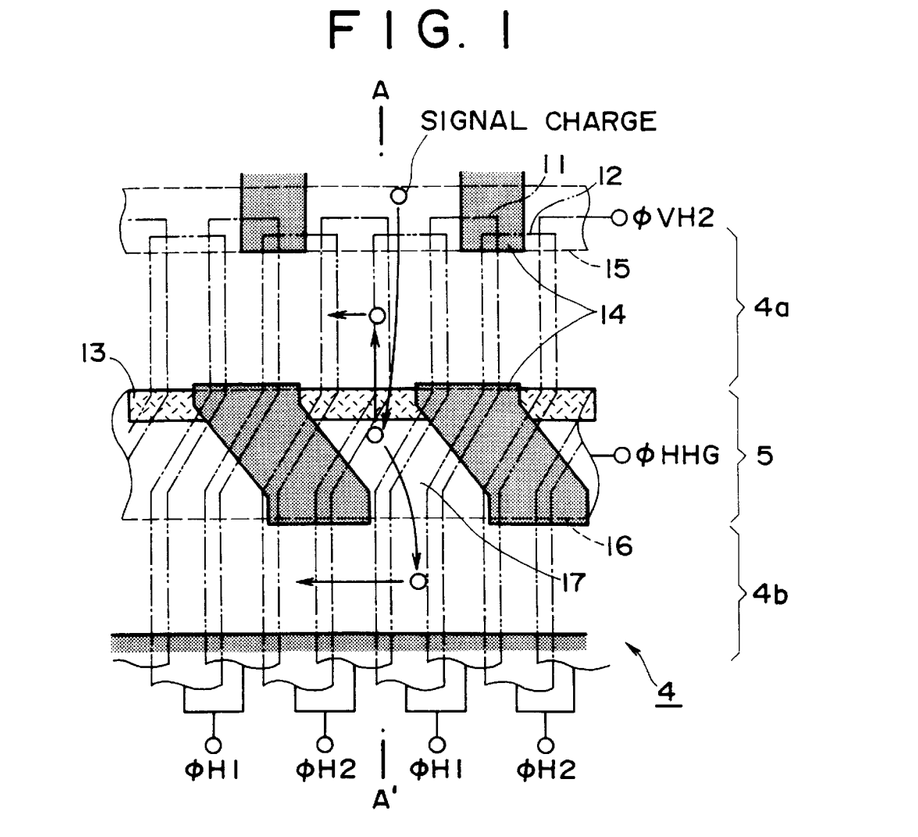
FIG. 1 is a plan view of the pattern indicating a first embodiment of the present invention.

FIG. 1 is a plan view of the pattern indicating a first embodiment of the present invention wherein only a part of the first horizontal transfer register 4 of FIG. 9 is illustrated. In FIG. 1, a first horizontal transfer register 4 is constituted of a pair of transfer sections 4a, 4b for horizontally transferring, by sharing, the signal charges of one line transferred from an image section 3 (refer to FIG. 9). These transfer sections 4a, 4b are arranged in parallel keeping short distance therebetween with almost equal channel width.

In this first horizontal transfer register 4, an accumulation gate electrode 11 indicated by a one-point-chain line in the figure and a transfer gate electrode 12 indicated by a two-point-chain line are alternately arranged in the horizontal transfer direction on a substrate forming a pair and these are 2-phase driven by the clock pulses $\phi H1$, $\phi H2$ for horizontal transfer to be applied to these gate electrodes pair. In the channel of the transfer sections 4a, 4b, a pair of bits for processing the signal charges of the same pixel are formed under the same accumulation gate electrode 11 and transfer gate electrode 12.

A control gate section 5 is provided between the transfer sections 4a, 4b to share the signal charges of the same pixel transferred from the image section 3 with the transfer sections 4a, 4b. In this control gate 5, a transfer channel 17 is formed between the bit ($\phi H2$) of the transfer section 4a and the bit ($\phi H1$) one bit after, in the horizontal transfer direction, the bit ($\phi H2$) of the transfer section 4b forming a pair with such bit ($\phi H2$) of the transfer section 4a. Moreover, a potential barrier section 13 is formed along the horizontal transfer direction in the side of the transfer section 4a of this transfer channel 17.

This potential barrier section 13 can be formed by implanting, to its forming position, an impurity of the conductivity type inverted from that of an impurity to form the transfer channel 17 or implanting, to the region of the control gate section 5 other than its forming position, an impurity of the same conductivity type as that of the transfer channel 17. Moreover, the potential barrier section 13 can also be formed by changing thickness of a gate oxide film (not illustrated) of the control gate section 5 in the region to form the potential barrier section 13 and in the other region. In FIG. 1, the shaded areas 14 indicate the channel stop sections. As is obvious from the figure, the channel stop section 14 is formed so that that the signal charges transferred to the bit of the first phase ($\phi H1$) of the transfer section 4b from the control gate section 5 do not enter the bit of the second phase ($\phi H2$).

Figure 2:
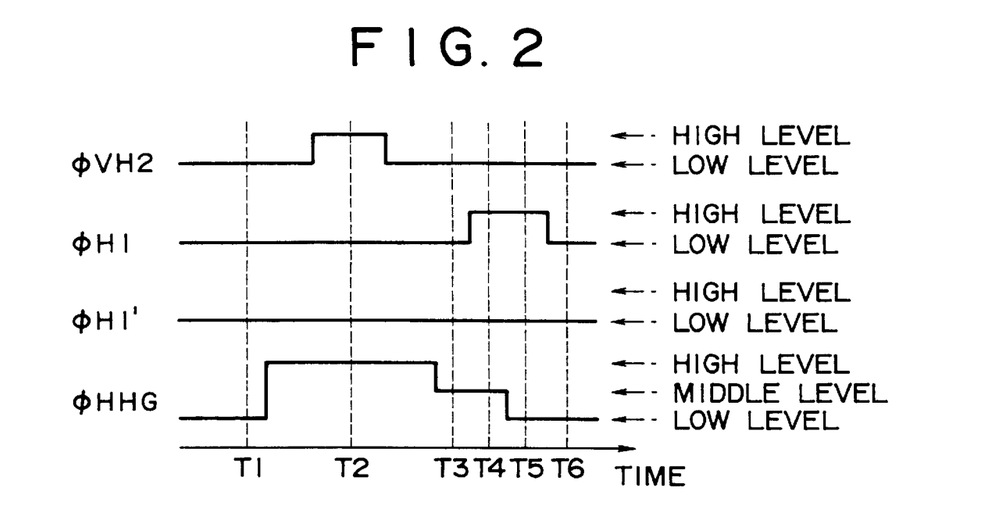
FIG. 2 is a timing chart for explaining sharing operation of signal charges in the first embodiment.
Figure 3:
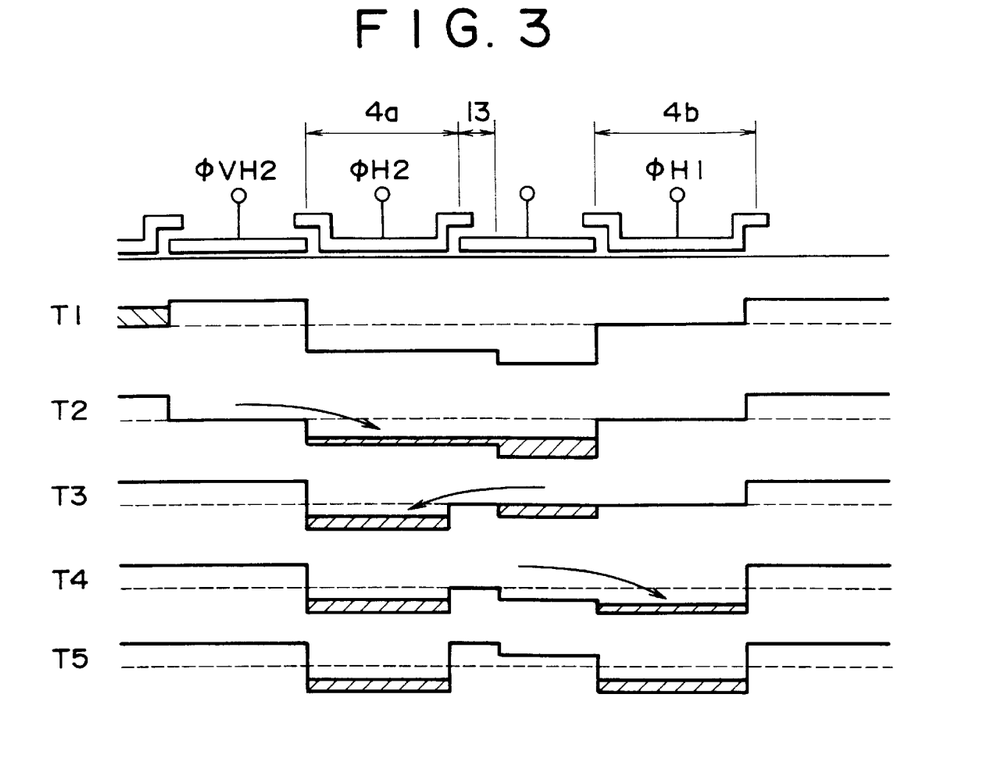
FIG. 3 is a potential diagram at the cross-section along the line A-A' in FIG. 1.

Next, the signal charge sharing operation in the first horizontal transfer register 4 in relation to the first embodiment in the constitution explained above will be explained with reference to the timing chart of FIG. 2 and the potential diagram of FIG. 3. In FIG. 2, $\phi VH2$ is a gate pulse impressed to the gate electrode 15 of the output section of the vertical transfer register 2, while $\phi H1$ is a clock pulse for horizontal transfer of the first phase and $\phi HHG$ is a gate pulse impressed to the gate electrode 16 of the control gate section 5. The clock pulse $\phi H2$ for horizontal transfer of the second phase is not indicated because it is always in the high level in such a timing as sharing signal charges. FIG. 3 shows potential distribution at the cross-section along the line A-A' in FIG. 1 and the times T1–T5 in this figure correspond to the times T1–T5 of FIG. 2.

At the time T1, the signal charges are now going to be transferred to the first horizontal transfer register 4 from the vertical transfer register 2. At the time T2 where the gate pulse $\phi VH2$ is in the high level, the signal charges are transferred to the first horizontal transfer register 4 from the vertical transfer register 2. Since the clock pulse φH1 is in the low level at the time T2, the potential of the transfer section 4b is shallow and moreover since the clock pulse φH2 is in the high level as explained above and the gate pulse φHHG is also in the high level, the potential of the transfer section 4a and control gate 5 is deep.

Therefore, the signal charges are transferred to the control gate 5 from the vertical transfer register 2 through the bit of the second phase (φH2) of the transfer section 4a and a large amount of signal charges is accumulated in the region other than the potential barrier section 13 because it is provided particularly in the control gate section 5. In the case where after the signal charges are once stored in the control gate section 5, the potential of the potential barrier section 13 becomes the middle level of the allowable variation range at the time T3 when the potential of the gate pulse φHHG becomes middle (intermediate) level, the signal charges are accumulated in the region of the control gate section 5 where the potential barrier section 13 is not provided as much as the amount of charges depending on the area of such region and the potential (height) of the potential barrier section 13.

Amount of this signal charge is determined, considering the signal charges processed by the transfer section 4b, depending on the area of the region of the control gate section 5 where the potential barrier section 13 is not provided and the potential of the potential barrier 13 and this signal charge is transferred in direct to the transfer section 4b. In this case, the potential of the potential barrier section 13 is set equal to or deeper than the potential of the transfer section 4b. Since the amount of charges which can be accumulated in the control gate section 5 is limited, the charges which cannot be accumulated in the control gate section 5 overflow from the potential barrier section 13 and return to the bit of the second phase (φH2) of the transfer section 4a and are also accumulated therein. That is, amount of charges horizontally transferred by the transfer section 4a is obtained by subtracting the amount of charges horizontally transferred by the transfer section 4b from the total amount of charges transferred from the vertical transfer register 2.

Figure 4:
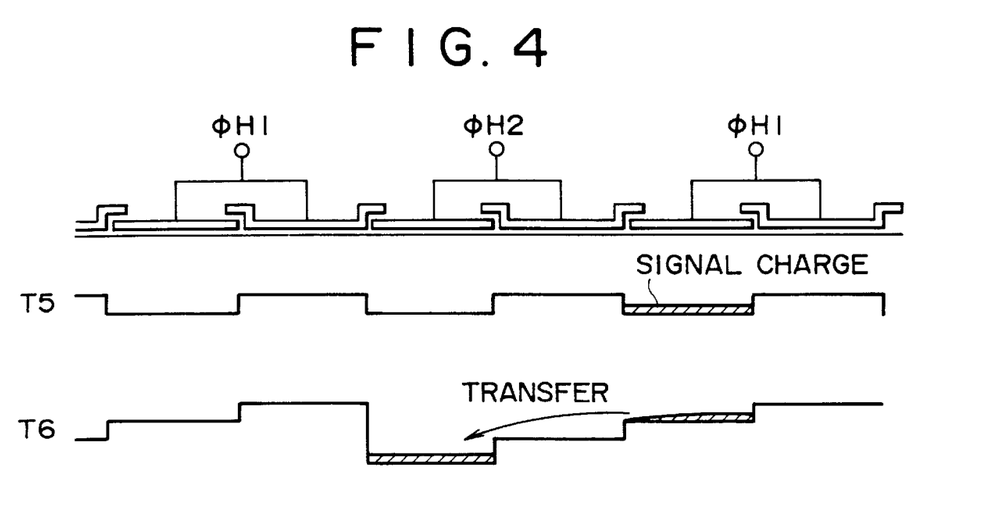
FIG. 4 is a potential diagram in the horizontal transfer direction of the transfer section 4b.

At the time T4 where the clock pulse (φH1) is in the high level, the potential of the transfer section 4b becomes deep causing the signal charges accumulated in the control gate section 5 to be transferred to the transfer section 4b. In this timing, the signal charges are transferred, through the transfer channel 17, to the bit of the first phase (φH1) one bit after, in the transfer direction of the transfer section 4b, the bit of the second phase (φH2) of the transfer section 4a where the signal charges of the same pixel are accumulated. At the time T5 where the gate pulse φHHG is in the low level, the potential of the control gate section 5 becomes shallowest, completing the transfer of the signal charges to the bit of the first phase (φH1) of the transfer section 4b. At the time T6 where the clock pulse φH1 is in the low level, the signal charges of the bit of the first phase (φH1) are transferred to the preceding bit of the second phase (φH2). The potential distribution in the horizontal transfer direction of the transfer section 4b at the times T5, T6 is shown in FIG. 4.

With a cycle of the operations explained above, the signal charges of the same pixel transferred to the first horizontal transfer register 4 from the vertical transfer register 2 are shared with the transfer sections 4a and 4b depending on the amount of charges to be processed in the transfer section 4b. Moreover, since the transfer channel 17 is formed, in the control gate section 5, between the bit of the transfer section 4a and the bit one bit after, in the horizontal transfer direction, the bit of the transfer section 4b forming a pair with the bit of the transfer section 4a and the signal charges of the same pixel are transferred to the bit of the first phase (φH1) one bit after, in the transfer direction in the transfer section 4b, the bit of the second phase (φH2) of the transfer section 4a, the signal charges shared with the two transfer sections 4a, 4b are surely transferred to a pair of bits of the transfer sections 4a, 4b not generating any mixing of the signal charges in the transfer section 4b and thereby a fault like a vertical stripe resulting from mixing signal charges is never generated. Meanwhile, since it is no longer necessary to make shallow the potential of the transfer section 4a in order to eliminate such a fault of image, amount of charges processed by the transfer section 4a is determined depending on a structure of the transfer section 4a without any limitation by the control gate section 5 and thereby amount of charges to be processed can be improved.

The signal charges shared with the transfer sections 4a and 4b in the first horizontal transfer register 4 are recovered to the signal charges of one pixel after the horizontal transfer. Recovery to signal charges of one pixel can be realized by providing again a lump of separated signal charges during the horizontal transfer by linking the channels of the transfer sections 4a, 4b, for example, in the final stage of the first horizontal transfer register 4, that is, in the area where the relevant register 4 is not required to be divided into two stages. Here, the area where the first horizontal transfer register 4 is not required to be divided into two stages means, for example, the area where the signal charges are not required to be transferred to the second horizontal transfer register 6 from the first horizontal transfer register 4 in the constitution of FIG. 9, in more practical, the horizontal dummy bit where the effective pixel signals are not transferred to the first horizontal transfer register 4 from the vertical transfer register 2.

In the embodiment explained above, the clock pulse φH1 is set to the high level when the signal charges are shared, but it may be remained in the low level as is indicated as the clock pulse φH1' in FIG. 2. In this case, since the shared signal charges are transferred to the bit of the second phase (φH2) passing the area under the accumulation gate electrode 11 of the first phase (φH1), the result obtained is same as that obtained when the clock pulse φH1 is set to the high level and is then set to the low level.

Figure 5:
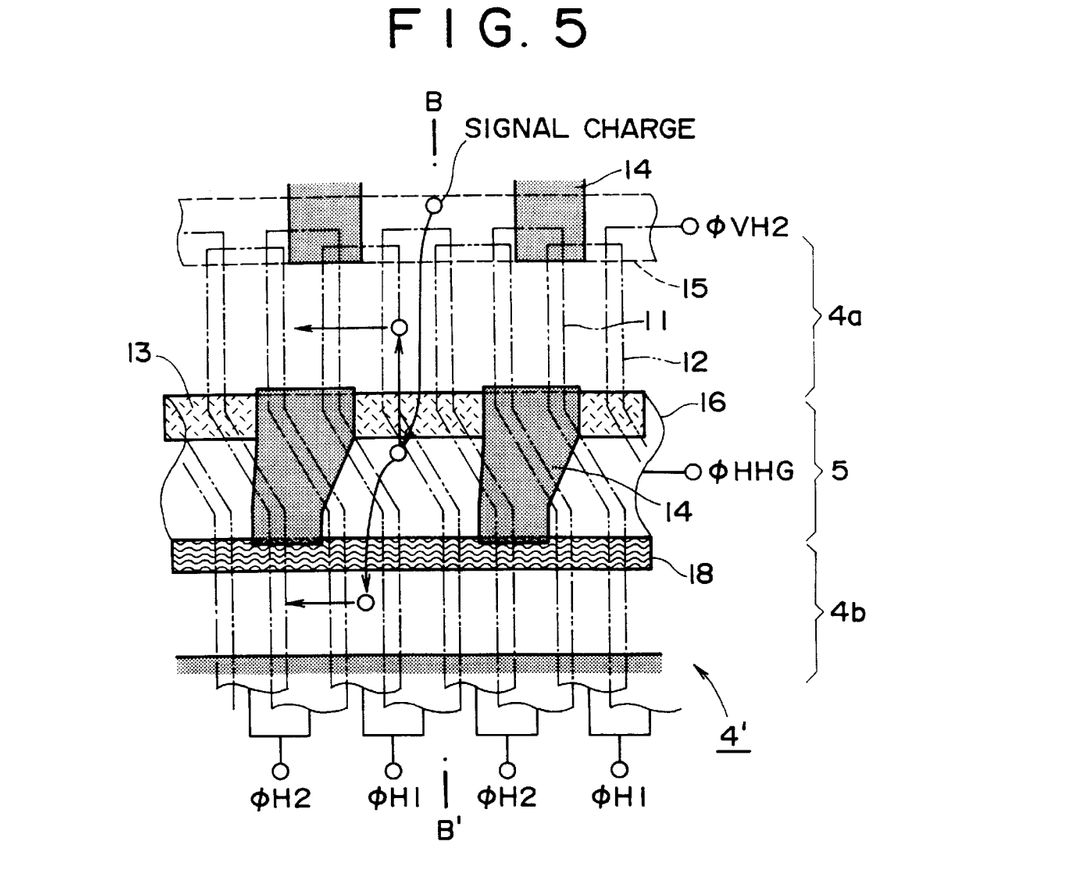
FIG. 5 is a plan view of the pattern indicating a second embodiment of the present invention.

FIG. 5 is a plan view of the pattern indicating the second embodiment of the present invention. In this figure, the elements like those of FIG. 1 are designated by the like reference numerals or symbols. In this second embodiment, in the plan view of the pattern structure like that of the prior art shown in FIG. 10, a potential barrier section 18 is formed along the horizontal transfer direction in the side of the control gate section 5 of the transfer section 4b. This potential barrier section 18 is formed, as in the case of the potential barrier section 13 in the previous embodiment, by controlling film thickness of a gate insulating film (gate oxide film) in the region of the potential barrier section 18 or controlling an impurity concentration.

In more practical, for example, in the case of controlling thickness of an oxide film with a burying channel, the potential barrier section 18 can be formed by making thinner the thickness of a gate oxide film. Moreover, in the case of controlling impurity concentration, such potential barrier 18 can be formed by implanting an impurity of the conductivity type inverted from that of the impurity to form a channel of the transfer section 4b or by implanting an impurity of the same conductivity type as the impurity explained above in the region of the transfer section 4b other than the area where the potential barrier 18 is formed. Here, the potential barrier section 13 is formed in such a manner that the potential of the bit of the first phase (φH1) in the transfer section 4b becomes deeper than the potential of the bit of the second phase (φH2) when the potential of the potential barrier section 18 becomes equal to the potential of the potential barrier section 13 of the control gate section 5.

Figure 6:
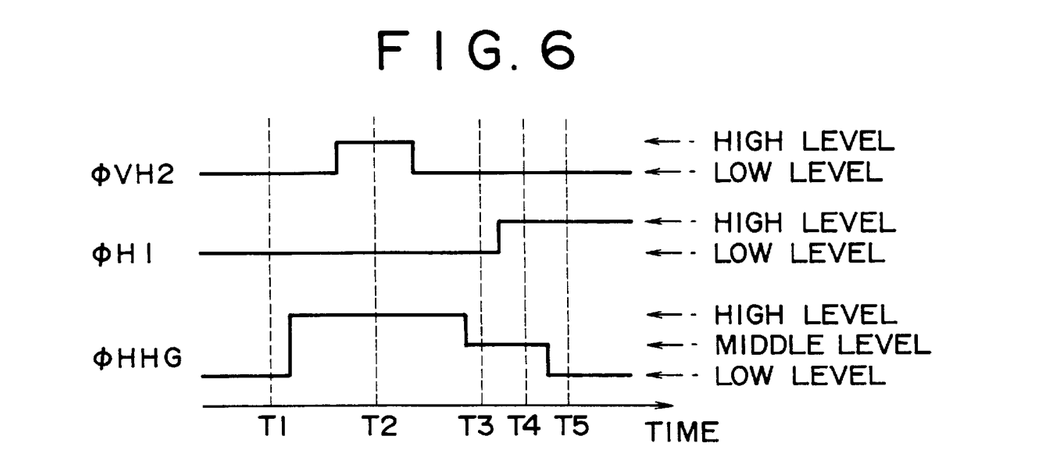
FIG. 6 is a timing chart for explaining sharing operation of signal charges in the second embodiment.
Figure 7:
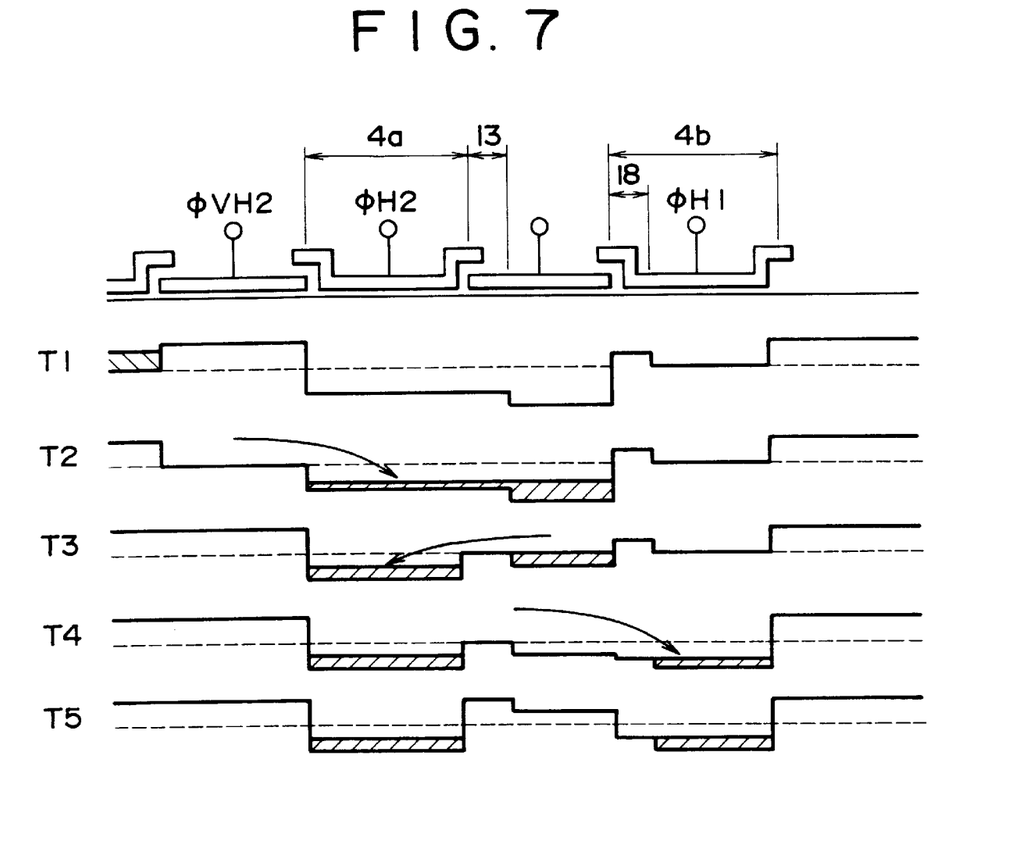
FIG. 7 is a potential diagram at the cross-section along the line B-B' in FIG. 5.

Next, sharing operation of the signal charges in the first horizontal transfer register 4' in relation to the second embodiment in the constitution explained above will be explained with reference to the timing chart of FIG. 6 and the potential diagram of FIG. 7. In FIG. 6, φVH2 is a gate pulse impressed to a gate electrode 15 of the output section of the vertical transfer register 2, φH1 is a horizontal transfer clock pulse of the first phase, φHHG is a gate pulse impressed to a gate electrode 16 of the control gate section 5. Here, the horizontal transfer clock pulse φH2 of the second phase is not illustrated because it is always set to the high level in the timing of sharing the signal charges. FIG. 7 shows a potential distribution of the cross-section along the line B-B' in FIG. 5. In this figure, the times T1–T5 correspond to the times T1–T5 of FIG. 6.

At the time T1, the signal charges are going to be transferred to the first horizontal transfer register 4' from the vertical transfer register 2. At the time T2 where the gate pulse φVH2 is in the high level, the signal charges are transferred to the first horizontal transfer register 4' from the vertical transfer register 2. Since the clock pulse φH1 is in the low level at the time T2, the potential of the transfer section 4b is shallow and moreover since the clock pulse φH2 and gate pulse φHHG are in the high level, the potential of the transfer section 4a and control gate section 5 is deep.

Therefore, the signal charges from the vertical transfer register 2 are transferred to the control gate section 5 through the bit of the second phase (φH2) of the transfer section 4a and particularly since the potential barrier section 13 is provided in the control gate section 5, such signal charges are accumulated in larger amount in the region other than the potential barrier section 13. At the time T3 where the potential of the gate pulse φHHG is in the middle level after the signal charges are accumulated in the control gate section 5, the potential of the potential barrier section 13 is in the middle level within its variable range. Thereby the signal charges are accumulated, in the region where there is no potential barrier section 13 of the control gate section 5, in such amount of charges depending on the area of such region and the potential of the potential barrier section 13.

In this case, the potential of the potential barrier section 13 is set to become equal to the potential of the potential barrier section 18 of the transfer section 4b or to become deeper than such potential. Since the amount of charges to be accumulated in the control gate section 5 is limited, the charges which cannot be accumulated in the control gate section 5 and overflows from the potential barrier section 13 are then accumulated in the bit of the second phase (φH2) to the transfer section 4a. At the time T4 where the clock pulse φH1 is in the high level, since the potential of the transfer section 4b becomes deep, the signal charges accumulated in the control gate section 5 are transferred to the bit of the first phase (φH1) of the transfer section 4b exceeding the potential barrier section 18.

In the transient period where this clock pulse φH1 changes to the high level from the low level (during period from the time T3 to the time T4), when the potential of the potential barrier section 18 of the transfer section 4b becomes deeper than the potential of the potential barrier section 13 of the control gate section 5, transfer of the signal charges accumulated in the control gate section 5 to the transfer section 4 is started. Here, as explained previously, the potential barrier section 18 of the transfer section 4b is formed so that when the potential thereof becomes equal to the potential of the potential barrier section 13 of the control gate section 5, the potential of the bit of the first phase (φH1) in the transfer section 4b becomes deeper than the potential of the bit of the second phase (φH2).

Figure 8:
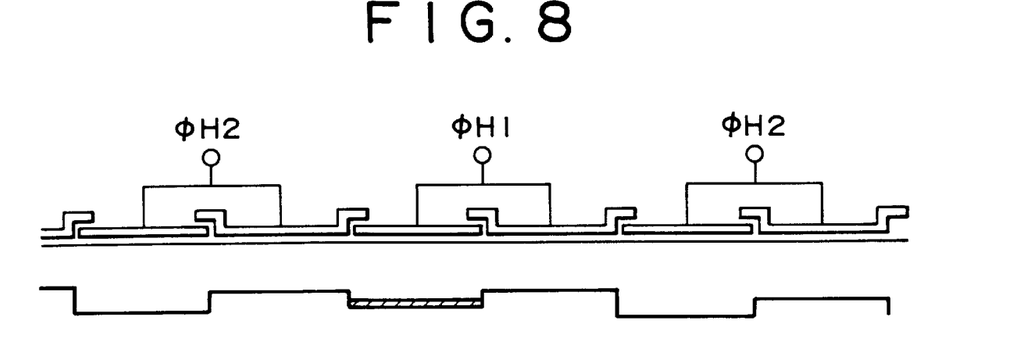
FIG. 8 is a potential diagram in the horizontal transfer direction of a potential barrier section 18 in the transient period where $\phi H1$ changes to high level from low level.

Thereby, when the signal charges accumulated in the control gate section 5 is transferred to the bit of the first phase of the transfer section 4b, the signal charges transferred are then transferred, in the case of the structure of the prior art, to the bit of the second phase, as is obvious from FIG. 12, resulting in the mixing of signal charges in the horizontal direction because the transfer section 4b is ready for the horizontal register transfer, while, in the case of the structure of this embodiment, since a barrier is formed to the bit of the second phase from the bit of the first phase due to the relationship of potentials as shown in FIG. 8, disabling the horizontal register transfer, transfer of the signal charges to the bit of the second phase is never carried out.

With a cycle of the operations explained above, since the signal charges of the same pixel transferred to the first horizontal transfer register 4 from the vertical transfer register 2 are shared with the transfer sections 4a, 4b depending on the amount of charges processed by the transfer section 4b and a potential barrier 18 is formed along the horizontal transfer direction to the side of the control gate section 5 of the transfer section 4b, the transfer section 4b can no longer transfer signal charges at the time of sharing the signal charges and thereby the mixing of signal charges is not generated in the transfer section 4b. As a result, a fault due to a vertical stripe in the image is never generated. Moreover, since it is not required to make shallow the potential of the transfer section 4a in order to eliminate such fault of image, amount of charges processed by the transfer section 4a is determined by the structure of the transfer section 4a and it is not limited by the control gate section 5, thereby improving the amount of charges to be processed.

In each embodiment explained above, a constitution that a clock which takes three levels is used as the gate pulse φHHG and the signal charges are shared in its middle level has been explained, but the clock which takes three levels is not always required and it is also possible to share the signal charges by sufficiently lowering the falling speed of the gate pulse φHHG using a delay circuit.

Moreover, when it is not required to share the signal charges considering the amount of charges to be processed by the transfer sections 4a, 4b, the signal charges can also be shared by shallowing the potential of the control gate section 5 without changing the potential of the transfer sections 4a, 4b after accumulating the signal charges transferred from the vertical transfer register 2 into the entire part of the first horizontal transfer register 4 including the control gate section 5. In this case, since the potential barrier section 13 exists in the control gate section 5, the high potential is formed in the side (side of the image section 3) of the first horizontal transfer register 4 in the control gate section 5 and low potential is formed in the opposite side. Therefore, the transfer can be realized smoothly for the vertical transfer of the signal charges to the second horizontal transfer register 6 from the first horizontal transfer register 4.

As explained previously, according to one aspect of the present invention, there is provided a solid state imaging apparatus comprising a first and a second horizontal transfer register to execute the horizontal transfer in the first horizontal transfer register in the side of the image section by sharing the signal charges of the same pixel with a pair of transfer sections, wherein the signal charges are never mixed in the transfer section in the side of the second horizontal transfer register because a transfer channel is formed between the bit of the transfer section in the side of the image section and the bit one bit after, in the horizontal transfer direction, the bit of the transfer section in the side of the second horizontal transfer register in the relation of forming a pair with above bit of the transfer section in the side of the image section and the signal charges are shared with a pair of transfer sections through this transfer channel. Thereby, the signal charges can be shared with a pair of transfer sections without generating a fault of image like a vertical stripe resulting from defective sharing of the signal charges. Moreover, since it is no longer required to make shallow the potential of the transfer section in the side of the image section, amount of charges to be processed in the transfer section is determined by the structure of the transfer section and is not limited by the control gate section, improving the amount of charges to be processed.

According to another aspect of the present invention, there is provided a solid state imaging apparatus comprising a first and a second horizontal transfer registers to execute the horizontal transfer by sharing the signal charges of the same pixel with a pair of transfer sections in the first horizontal transfer register in the side of the image section, wherein the signal charges are never mixed in the relevant transfer section because since a potential barrier section is formed along the horizontal transfer direction in the side of the control gate section of the transfer section in the side of the second horizontal transfer register, the relevant transfer section is disabled to execute the horizontal register transfer at the time of transferring the signal charges accumulated in the control gate section to the transfer section in the side of the second horizontal transfer register. Thereby, the signal charges can be shared with a pair of transfer sections without generation of a fault of image like a vertical stripe resulting from defective sharing of the signal charges. Moreover, since it is unnecessary to make shallow the potential of the transfer section in the side of the image section to eliminate a fault of image, amount of charges to be processed by the relevant transfer section is determined by the constitution thereof and is not limited by the control gate section, improving the amount of charges to be processed.

What is claimed is:

1. A solid state imaging apparatus comprising:
    an image section for producing signal charges corresponding to a plurality of pixels arranged in a matrix;
    a first horizontal transfer register for horizontally transferring the signal charges received from said image section;
    said first horizontal transfer register comprising:
        first and second transfer sections having first and second bits, respectively, for horizontally transferring the signal charges corresponding to a pixel in said plurality of pixels;
        a control gate section formed between said first and second transfer sections for accumulating the signal charges transferred from said image section and for sharing said signal charges with said first and second transfer sections;
        a potential barrier formed along a horizontal transfer direction in said control gate section; and
        a channel stop section formed in said control gate section for forming a transfer channel between the first bit of said first transfer section and a third bit in said second transfer section, the third bit, in the horizontal transfer direction, being after the second bit of said second transfer section forming a pair with the first bit of said first transfer section; and
    a second horizontal transfer register for horizontally transferring the signal charges transferred through said first horizontal transfer register.

2. A solid state imaging apparatus according to claim 1, wherein said first transfer section is closer in said image section and said second transfer section is closer to said second horizontal transfer register.

3. A solid state imaging apparatus according to claim 1, wherein said potential barrier section is formed by implantation of a first impurity having a conductivity type inverted from that of a second impurity to form said transfer channel.

4. A solid state imaging apparatus according to claim 1, wherein said potential barrier section is formed by implanting an impurity to a region of the control gate section other than the potential barrier section forming position.

5. A solid state imaging apparatus according to claim 1, wherein said potential barrier section is formed in such a manner that thickness of a gate oxide film is different in the potential barrier forming region and the other region.

6. A solid state imaging apparatus according to claim 2, wherein said transfer channel is formed between the bit of said first transfer section and the bit half bit after, in the horizontal direction, the bit of said second transfer section forming a pair with the bit of said first transfer section.

7. A solid state imaging apparatus comprising:
    an image section for producing signal charges corresponding to a plurality of pixels arranged in a matrix;
    a first horizontal transfer register for horizontally transferring the signal charges received from said image section;
    said first horizontal transfer register comprising:
        first and second transfer sections respectively for transferring horizontally the signal charges corresponding to a pixel in said plurality of pixels;
        a control gate section formed between said first and second transfer sections to accumulate the signal charges transferred from said image section and thereafter share these signal charges with said first and second transfer sections; and
        a first potential barrier section formed along a horizontal transfer direction in said control gate section;
    a second horizontal transfer register for horizontally transferring the signal charges transferred through said first horizontal transfer register; and
    a second potential barrier section formed along the horizontal transfer direction in said control gate section of the second transfer section along said second horizontal transfer register between said first and second transfer sections.

8. A solid state imaging apparatus according to claim 7, wherein said first potential barrier section is formed by implantation of a first impurity having a conductivity type inverted from that of a second impurity to form said transfer channel.

9. A solid state imaging apparatus according to claim 7, wherein said first potential barrier section is formed by implanting an impurity to a region of the control gate section other than the potential barrier section forming position.

10. A solid state imaging apparatus according to claim 7, wherein said second potential barrier section is formed so that a potential of a first bit of a first phase in the second transfer section in the first horizontal transfer register becomes deeper than that of a second bit of a second phase when the potential of said second potential barrier section becomes equal to that of said first potential barrier section.

* * * * *